United States Patent
Su et al.

(10) Patent No.: US 12,469,760 B2
(45) Date of Patent: Nov. 11, 2025

(54) SEMICONDUCTOR STRUCTURES AND METHODS FOR MANUFACTURING THE SAME

(71) Applicant: TAIWAN SEMICONDUCTOR MANUFACTURING COMPANY, LTD., Hsinchu (TW)

(72) Inventors: Jui-Wen Su, Hsinchu (TW); Shi-Hua Tzeng, Hsinchu (TW); Chih-Hung Lu, Hsinchu (TW); Po-Chi Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 18/140,553

(22) Filed: Apr. 27, 2023

(65) Prior Publication Data
US 2024/0363467 A1    Oct. 31, 2024

(51) Int. Cl.
*H01L 23/31* (2006.01)
*H01L 21/56* (2006.01)
*H01L 21/768* (2006.01)
*H10D 84/80* (2025.01)

(52) U.S. Cl.
CPC .......... *H01L 23/3171* (2013.01); *H01L 21/56* (2013.01); *H01L 21/76804* (2013.01); *H10D 84/811* (2025.01)

(58) Field of Classification Search
None
See application file for complete search history.

(56) References Cited

U.S. PATENT DOCUMENTS

| | | | |
|---|---|---|---|
| 2008/0237880 A1* | 10/2008 | Lin | H01L 23/5227 257/E21.294 |
| 2010/0230811 A1* | 9/2010 | Shin | H01L 24/05 257/737 |
| 2011/0121438 A1* | 5/2011 | Hart | H01L 24/17 257/737 |
| 2013/0234316 A1* | 9/2013 | Daubenspeck | H01L 24/03 257/737 |
| 2017/0243899 A1 | 8/2017 | Miyairi et al. | |
| 2020/0091073 A1* | 3/2020 | Liao | H01L 21/76801 |
| 2020/0105634 A1* | 4/2020 | Huang | H01L 24/03 |
| 2021/0098399 A1* | 4/2021 | Huang | H01L 21/02315 |
| 2021/0134746 A1* | 5/2021 | Chang | H01L 23/3192 |
| 2021/0305188 A1* | 9/2021 | Shin | H01L 25/0652 |

* cited by examiner

*Primary Examiner* — Alexander G Ghyka
(74) *Attorney, Agent, or Firm* — STUDEBAKER BRACKETT PLLC

(57) ABSTRACT

In order to reduce the incidence of stress concentration areas in an etched opening, a thinner polyimide layer is deposited to minimize gap formation therein, and a descum process is then performed to increase the angle of the presented layer surface. Reduction of the stress in this manner reduces the incidence of cracking of the later formed metal contact, which improves the overall pass rates of semiconductor devices so manufactured.

20 Claims, 15 Drawing Sheets

SEMICONDUCTOR STRUCTURES AND METHODS FOR MANUFACTURING THE SAME

BACKGROUND

Integrated circuits (ICs) are formed on semiconductor dies that include millions or billions of individual semiconductor devices. For example, transistor devices are configured to act as switches, and/or to produce power gains, so as to enable logical functionality for an IC chip (e.g., functionality to perform logic functions). IC chips often also include passive electronic devices, such as capacitors, resistors, inductors and the like. Passive devices are widely used to control chip characteristics (e.g., gain, time constants, and the like) so as to provide an integrated chip with a wide range of different functionalities (e.g., incorporating both analog and digital circuitry on the same die). Capacitors, such as metal-insulator-metal (MIM) capacitors, which include at least a top metal plate and a bottom metal plate separated by an insulating dielectric, are often implemented in ICs.

High-density ICs, such as Very Large Scale Integration (VLSI) circuits and system on integrated chips (SoIC), are typically formed with interconnect structures (also referred to as interconnects) to properly connect densely packed devices together to form functional circuits. With increasing levels of integration, a parasitic capacitance effect between the metal lines of the interconnects correspondingly increases, which leads to signal delay and cross-talk. In order to reduce the parasitic capacitance and increase the conduction speed of the interconnections, dielectric materials with a low dielectric constant (low-k) are commonly employed to form interlayer dielectric (ILD) layers and inter-metal dielectric (IMD) layers. Metal lines and vias are then formed in such layers. Conductive bumps, such as micro-bumps (µ-bumps) and Controlled Collapse Chip Connection (C4) bumps, are formed over these interconnect structures for connection with other devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
FIG. 1A, FIG. 1B, FIG. 1C, FIG. 1D, FIG. 1E, FIG. 1F, FIG. 1G and FIG. 1H are cross-sectional views of various stages of a sequential fabrication process of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One skilled in the art will readily appreciate that each pair of like features shown in cross-section on opposing sides of an opening gap or via are merely artifacts of the cross-sectional view depicted in the Figures. In various embodiments, each such pair of features are actually opposing vertical or near-vertical edges of an otherwise continuous three-dimensional semiconductor feature.

As semiconductor technology evolves, a geometrical size of interconnect structures decreases in order to increase IC density, thereby lowering manufacturing costs and improving device performance. In various embodiments, the interconnect structures include lateral interconnections, such as metal lines (wirings), and vertical interconnections, such as contacts and via plugs. Further, one or more passivation layers are formed to protect the semiconductor device from moisture, etc. One type of semiconductor packaging is a System on Integrated Chip (SoIC) packaging, in which multiple dies are integrated in a single package and Controlled Collapse Chip Connection (C4) devices.

FIG. 1A, FIG. 1B, FIG. 1C, FIG. 1D, FIG. 1E, FIG. 1F, FIG. 1G and FIG. 1H are cross-sectional views of an initial stage of a sequential fabrication process of a semiconductor device 100 in accordance with various embodiments. It is understood that additional operations can be provided before, during, and after the processes shown by FIGS. 1A-1H, and some of the operations described below can be replaced or eliminated, for additional embodiments of the method. The order of the operations/processes may be interchangeable. As illustrated in the Figures and described herein in various embodiments, the semiconductor device 100 includes one or more capacitive devices, transistors, and other electrical components (not shown) although other types of semiconductor devices of suitable construction are readily contemplated.

Turning to FIG. 1A, in various embodiments, the semiconductor device 100 includes a semiconductor substrate 10, or wafer, which, in various embodiments, is a bulk semiconductor substrate, a semiconductor-on-insulator (SOI) substrate, or another substrate. In various embodiments, the semiconductor material of the semiconductor substrate 10 is doped or un-doped, such as with a P-type or an N-type dopant. Other substrates, such as a multi-layered or gradient substrates are also used in various embodiments. In some embodiments, the semiconductor material of the semiconductor substrate 10 may include an elemental semiconductor like silicon (Si) (e.g., crystalline silicon, like Si<100> or Si<111>) and germanium (Ge); or a compound semiconductor including silicon carbide ($Si_xC_y$), gallium arsenide ($Ga_xAs_y$), gallium phosphide ($Ga_xP_y$), indium phosphide ($In_xP_y$), indium arsenide ($In_xAs_y$), and/or indium antimonide ($In_xSb_y$); or an alloy semiconductor including $Si_xGe_y$, $Ga_xAs_yP_z$, aluminum indium arsenide ($Al_xIn_yAs_z$), $Al_xGa_yAs_z$, $Ga_xIn_yAs_z$, $Ga_xIn_yP_z$, $Ga_wIn_xAs_yP_z$ or a combination thereof.

Figure 1B:
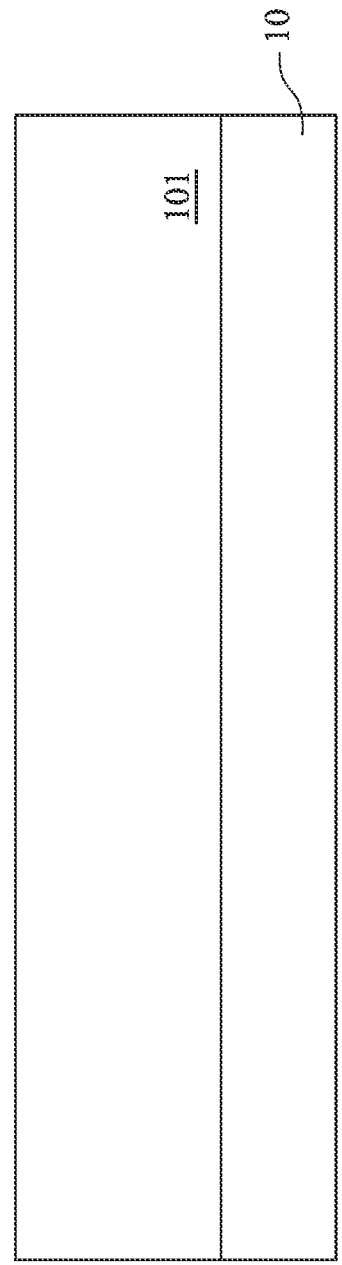

In various embodiments, as shown in FIG. 1B, one or more interlayer dielectric (ILD) layers 101 are formed over the substrate 10 and its electronic elements. In some embodiments, the ILD layer 101 includes a dielectric material, such as silicon oxide ($Si_xO_y$), silicon nitride ($Si_xN_y$), SiON, SiOCN, SiCN, a low-k dielectric material, or any other suitable dielectric material.

Figure 1C:
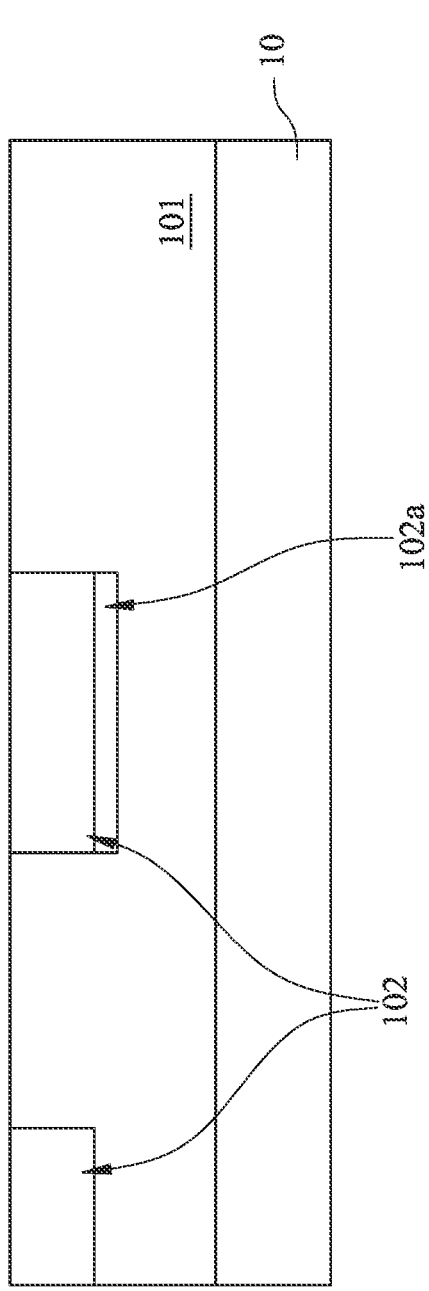

In various embodiments, as shown in FIG. 1C, a top metal (TM) layer 102 is disposed in one or more sections of the ILD layer 101 near a top surface of the ILD layer 101. An interconnect structure 102a is first deposited below the TM layer 102 in some instances. In various embodiments, the TM layer 102 has a top surface that is coextensive and coplanar with the top surface of the ILD layer 101. In various embodiments, the TM layer 102 resides above and electrically coupled to a transistor or other electrical connection features (not shown). In some embodiments, the TM layer 102 includes a metal or metal alloy such as copper, cobalt, nickel, aluminum, tungsten, titanium, or combinations thereof. In some embodiments, the TM layer 102 is formed by a damascene process including deposition or plating of a conductive material, followed by a chemical mechanical planarization (CMP) process. In some embodiments, the TM layer 102 is the topmost conductive layer formed by a damascene process. In some embodiments, the TM layer 102 is a pad electrode.

Figure 1D:
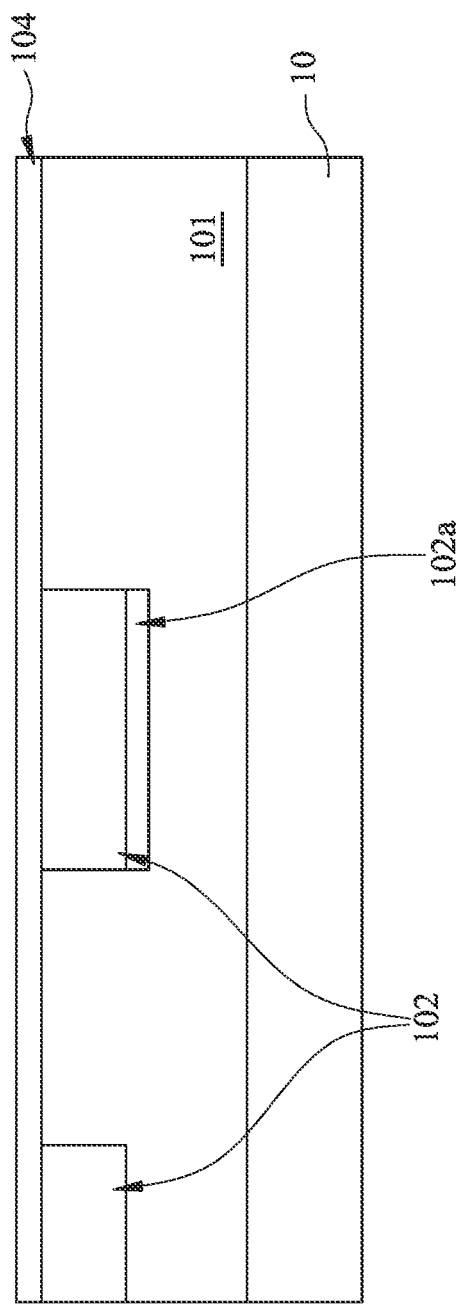

In various embodiments, as shown in FIG. 1D, an etch stop layer (ESL) 104 is deposited and disposed on the top surfaces of the ILD layer 101 and the TM layer 102, in order to protect the underlying layers from moisture and delamination during additional processing steps while forming the semiconductor device 100. In some embodiments, the ESL 104 has a thickness between about 0.2 nm to about 2 μm. In some instances, the ESL 104 may include silicon nitride ($Si_xN_y$), or the like. In other embodiments, the ESL 104 includes SiO, silicon oxynitride ($SiO_xN_y$), silicon carbonitride (SiCN), silicon oxycarbide (SiOC), silicon carbide (SiC), silicon oxycarbonitride (SiOCN), chromium oxide (CrO) or combinations thereof.

In various instances, the ESL 104 is partially removed from the top surface of the TM layer 102 after deposition, such as with a mask and subsequent etching process or by thinning. In some embodiments, a thickness of the remaining etch stop layer 104 over the ILD layer 101 is in a range from about 10 nm to about 300 nm and is in a range from about 50 nm to about 100 nm in other instances.

Figure 1E:
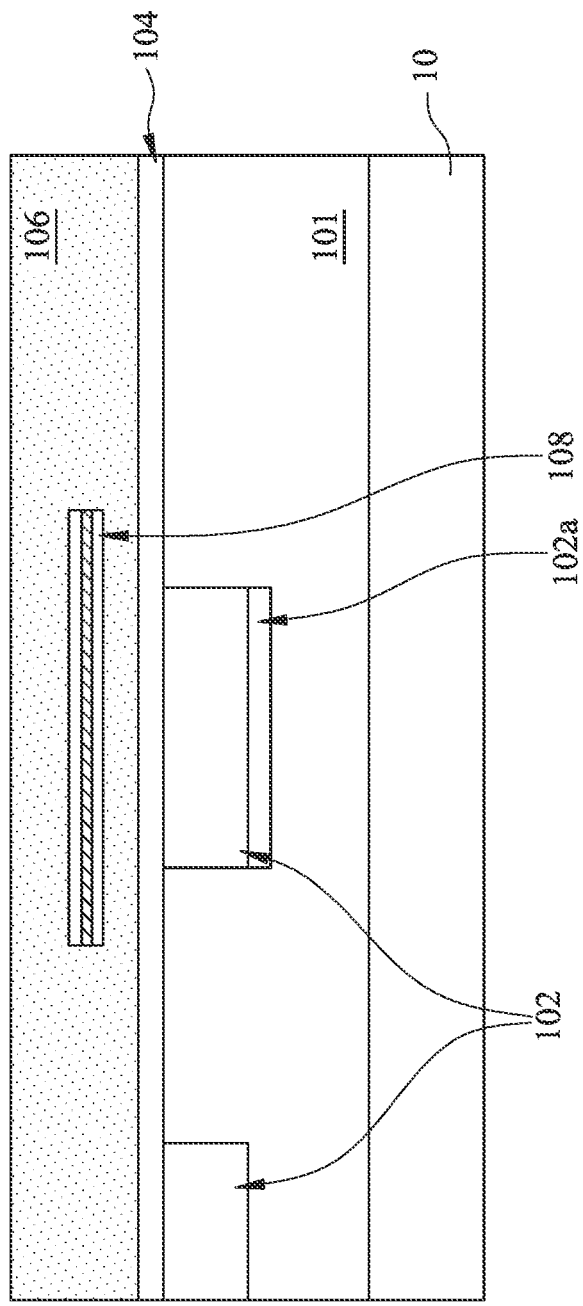

Turning to FIG. 1E, in various embodiments, a first passivation layer 106 is next deposited and disposed on the top surface of the etch stop layer 104. In some instances, the first passivation layer 106 is composed of glass-like material, such as undoped silicate glass (USG), or the like. However, the material of the first passivation layer 106 is not limited thereto, and may include silicon oxide, doped silicate glass, or any other suitable materials. A variety of insulating materials that provide sufficient supporting strength and a low-roughness top surface are also used in various embodiments. In some embodiments, the first passivation layer 106 is formed of two or more separately deposited, coextensive layers of like material to accommodate an intervening structure disposed therebetween. In some embodiments, the first passivation layer 106 has a combined thickness of its one or more layers between about 0.1 micrometers (μm) and about 2 μm, and between about 0.8 μm and about 1.2 μm in other embodiments.

In some embodiments, an intervening metal-insulator-metal (MIM) capacitor 108 is disposed between the two layers of the first passivation layer 106. A MIM capacitor 108 is one type of manufactured capacitor. In various embodiments, MIM capacitors 108 include at least two terminals or conductive plates, with each plate separated by a dielectric insulating layer. In various embodiments, MIM capacitors 108 are useful for storing electric potential energy, voltage regulation, and/or to mitigate noise on an electrical line.

In various embodiments, the MIM capacitor 108 includes a bottom terminal (not shown) and a top terminal (not shown), with an insulating layer disposed there-between. In some embodiments, a material of the bottom terminal and the top terminal includes conductive materials, such as titanium nitride (TiN), titanium (Ti), aluminum (Al), indium tin oxide (ITO), tungsten (W), tungsten nitride (WN), tantalum nitride (TaN), tantalum (Ta), rhenium trioxide ($ReO_3$), rhenium oxide ($ReO_2$), iridium oxide ($IrO_2$), ruthenium (Ru), osmium (Os), palladium (Pd), platinum (Pt), copper (Cu), molybdenum nitride (MoN), molybdenum (Mo), another conductive metal, a combination thereof, or the like. In some embodiments, a thickness of the bottom terminal and the top terminal is between about 1 nanometers (nm) and 1 μm, but the present disclosure is not limited thereto. In some embodiments, both the bottom terminal and the top terminal include at least a common overlapping portion, thus forming a capacitor within a capacitance region of the semiconductor device 100.

In some embodiments, the MIM capacitor 108 further includes a high-k dielectric layer that separates the bottom terminal from the top terminal. In some embodiments, the high-k dielectric layer provides a separation spacing between each of these terminals. In some embodiments, the separation spacing between adjacent terminals within the capacitance region is between about 1 nm and about 1 μm, in accordance with the thickness of the high-k dielectric layer. In some embodiments, the high-k dielectric layer includes at least one of aluminum oxide ($Al_xO_y$), zirconium oxide ($Zr_xO_y$), silicon nitride ($Si_xN_y$), tantalum nitride ($Ta_xO_y$), titanium oxide ($Ti_xO_y$), strontium titanate ($Sr_xTi_yO_z$), yttrium oxide ($Y_xO_y$), lanthanum oxide ($La_xO_y$), hafnium oxide ($Hf_xO_y$), a multi-layer structure of the combination thereof, or the like.

In some embodiments, the MIM capacitor 108 includes one or more additional terminals and insulating layers disposed between and/or above or below the bottom terminal and the top terminal. In some embodiments, one or more of the terminals of the MIM capacitor 108 are either connected to or isolated from an electrical contact. It should be noted that if the total amount of terminals is more than two, the configuration of the MIM capacitor 108 may be varied accordingly. In some embodiments where the MIM capacitor 108 has at least three terminals, less than all of the terminals are simultaneously connected to the electrical contact.

Figure 1F:
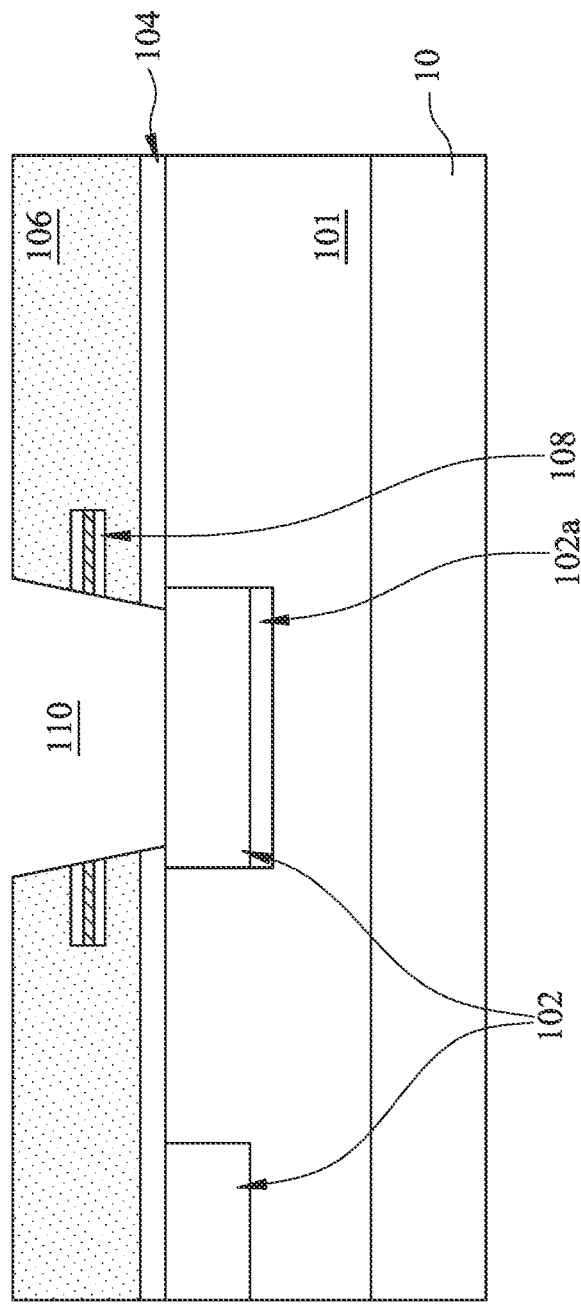

Turning now to FIG. 1F, in various embodiments, one or more terminals of the MIM capacitor 108 are connected with a metal (i.e., aluminum) pad (not shown) to one or more of the TM layer 102 and a redistribution layer (RDL) 114 (described later below) by an intervening redistribution via hole (RV) 110 having a contact metal deposited and disposed therein as described in detail later below. In various embodiments, the RV 110 extends through the first passivation layer 106 and a section of the MIM capacitor 108 for electrically connecting the TM layer 102 with the MIM capacitor 108 using a contact metal disposed within the RV 110. In some embodiments, the RV 110 has a height of between about 0.1 µm and about 2 µm, depending on design requirements and the height of the first passivation layer 106. In some embodiments, the RV 110 has width of about 1 µm to about 10 µm, depending on design requirements.

In various embodiments, the RV 110 is formed by etching through the first passivation layer 106 and a section of the MIM capacitor 108 to yield a continuous opening extending from a top surface of the first passivation layer 106 to a top surface of the TM layer 102 as shown in FIG. 1F. In some instances, the RV 110 extends through the first passivation layer 106 and tapers linearly from the top surface of the first passivation layer 106 toward the top surface of the TM layer 102, as shown in cross-section in the Figures.

Figure 1G:
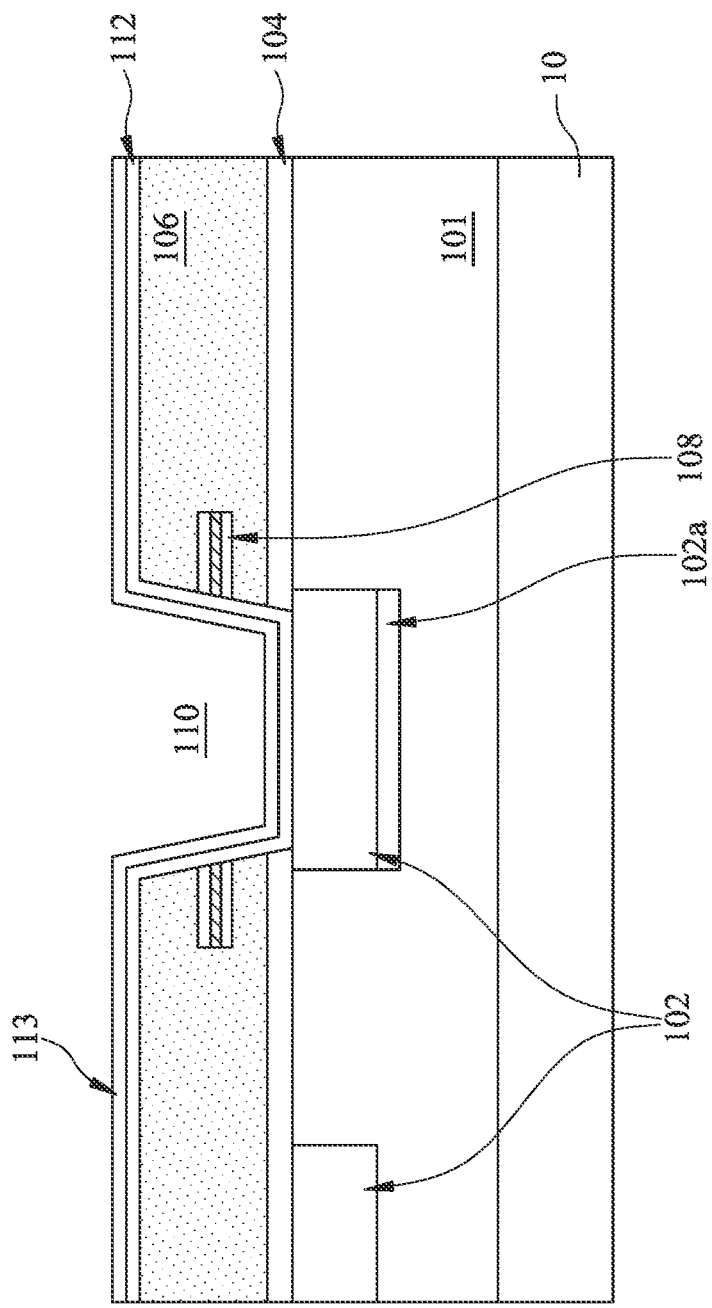

Turning to FIG. 1G, a barrier layer 112 is deposited and provided over the first passivation layer 106 and within the RV via 110. In some embodiments, the barrier layer 112 is provided to prevent damage by blocking diffusion of metals to the underlying layers of the semiconductor device 100 resulting from later manufacturing operations. In some cases, the barrier layer is composed of titanium (Ti), titanium nitride ($Ti_xN_y$), tantalum (Ta), tantalum nitride (TaN), or the like, and may be formed by chemical vapor deposition (CVD), physical vapor deposition (PVD), atomic layer deposition (ALD), or the like. In some embodiments, the barrier layer 112 is between 1 nm and 100 nm in thickness.

In various embodiments, a metal seed layer 113 is next deposited and provided over the barrier layer 112. In some embodiments, the metal seed layer 113 is provided to prevent migration of the contact metal between the TM layer 102 and subsequently deposited metals described in various embodiments herein. In some embodiments, the metal seed layer 113 is composed of copper. In some instances, a copper content of the metal seed layer 113 is less than a copper content of subsequently deposited metal layers thereon as described later below. In some cases, the metal seed layer 113 is omitted.

Figure 1H:
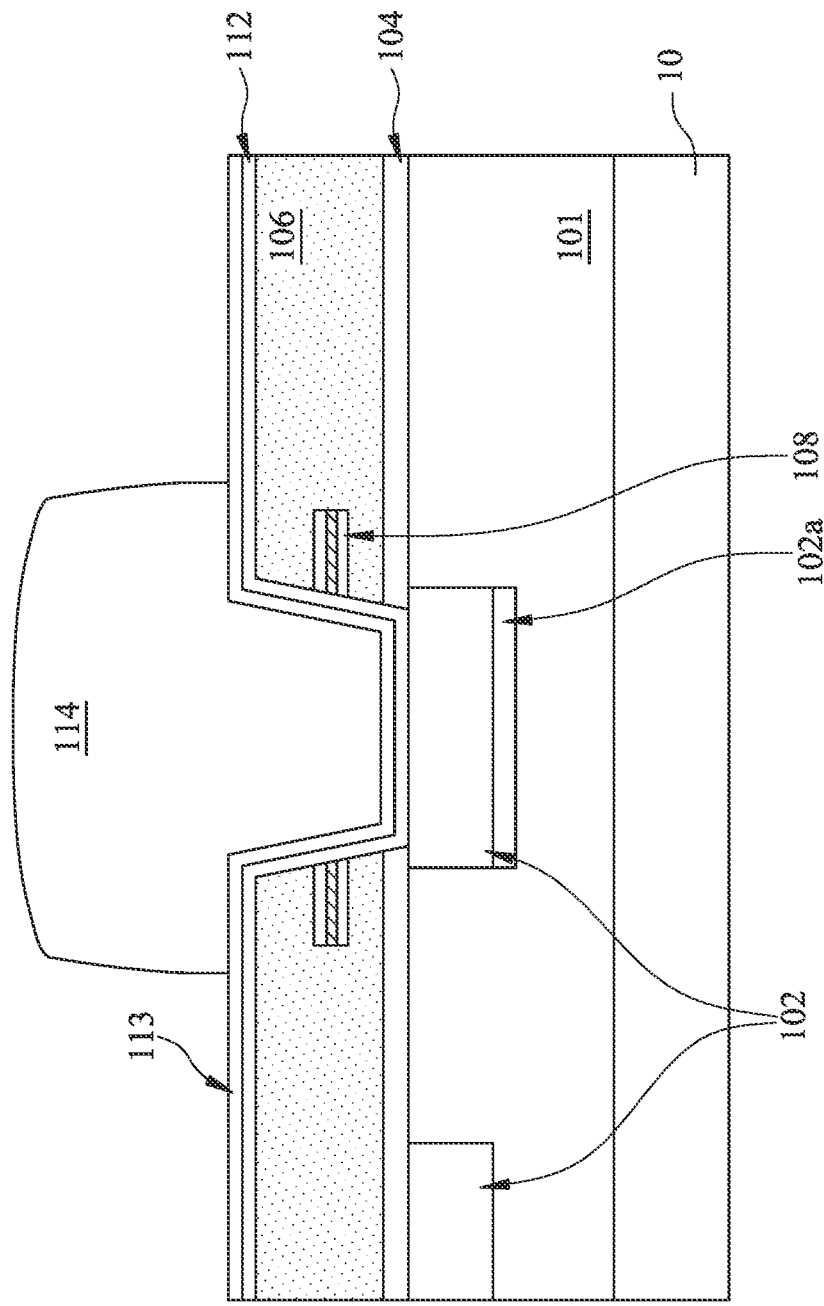

As described in the forgoing, the RV 110 is formed to electrically connect the MIM capacitor 108 and the TM layer 102 in various cases. Turning to FIG. 1H, in various embodiments, this is achieved by depositing a contact metal, such as metal RDL 114 within the RV 110 over the metal seed layer 113. In some embodiments, the metal RDL 114 is composed of at least one conductive material, such as one or more of aluminum (Al), copper (Cu), aluminum copper (AlCu), gold (Au), tungsten (W), iron (Fe), titanium (Ti), tantalum (Ta), cobalt (Co), tin (Sn) and germanium (Ge), which provide sufficient conductivity at varying material cost. In various embodiments, the conductive material is deposited within and around the RV 110 using one or more of CVD, PVD and electrochemical plating (ECP).

The metal RDL 114 within the RV 110 is disposed through the first passivation layer 106 including the MIM capacitor 108, to provide electrical contact with the underlying TM layer 102. In some embodiments, the RDL 114 is deposited and disposed on the top surface of the passivation layer 106 by CVD, ECP or PVD. In some embodiments, the RDL 114 has a thickness between about 1 µm and around 5 µm over the first passivation layer 106. In some embodiments, the RDL 114 has a width/space (W/S) ratio of between about 1 um/1 um and about 10 um/10 um.

In various embodiments, the RDL 114 is deposited as a single continuous layer over the passivation layer 106. In other cases, the RDL 114 is formed from a series of layers and deposition processes. In various instances, the RDL 114 is then etched in various locations to form one or more trenches (not shown) that provide electrical isolation in accordance with design requirements, while other portions of the RDL 114 remain un-etched.

In various instances, the top surface of the RDL 114 is rounded. In some embodiments, the rounded top surface of the metal RDL 114 is formed by a straining of the underlying first passivation layer 106. In some embodiments, the rounded shape is formed by mask layer trimming. In some embodiments, the rounded shaped is adjusted by a curing process. In some instances, the top surface is not rounded.

With smaller process geometries required in manufacturing, more defects (such as voids) are generated around the sidewalls of the RDL 114 and between the resulting structures of the semiconductor device 100. Voids and kinks weaken the mechanical strength of the semiconductor device 100 and are susceptible to being filled during subsequent deposition processes, which changes the electrical properties of the RDL 114 in some cases. Therefore, the production yield of semiconductor devices 100 in bulk is sensitive to such defect formation.

In order to prevent such failures, in various embodiments, a process of forming the remaining layers of the semiconductor device 100 reduces the residual stresses during subsequent film depositing, curing and cooling. With reduced opportunity for kinks and voids to be developed, the process window of the semiconductor device 100 is enlarged and becomes more robust, without significantly making the manufacture of the semiconductor device 100 more complicated.

Figure 2A:
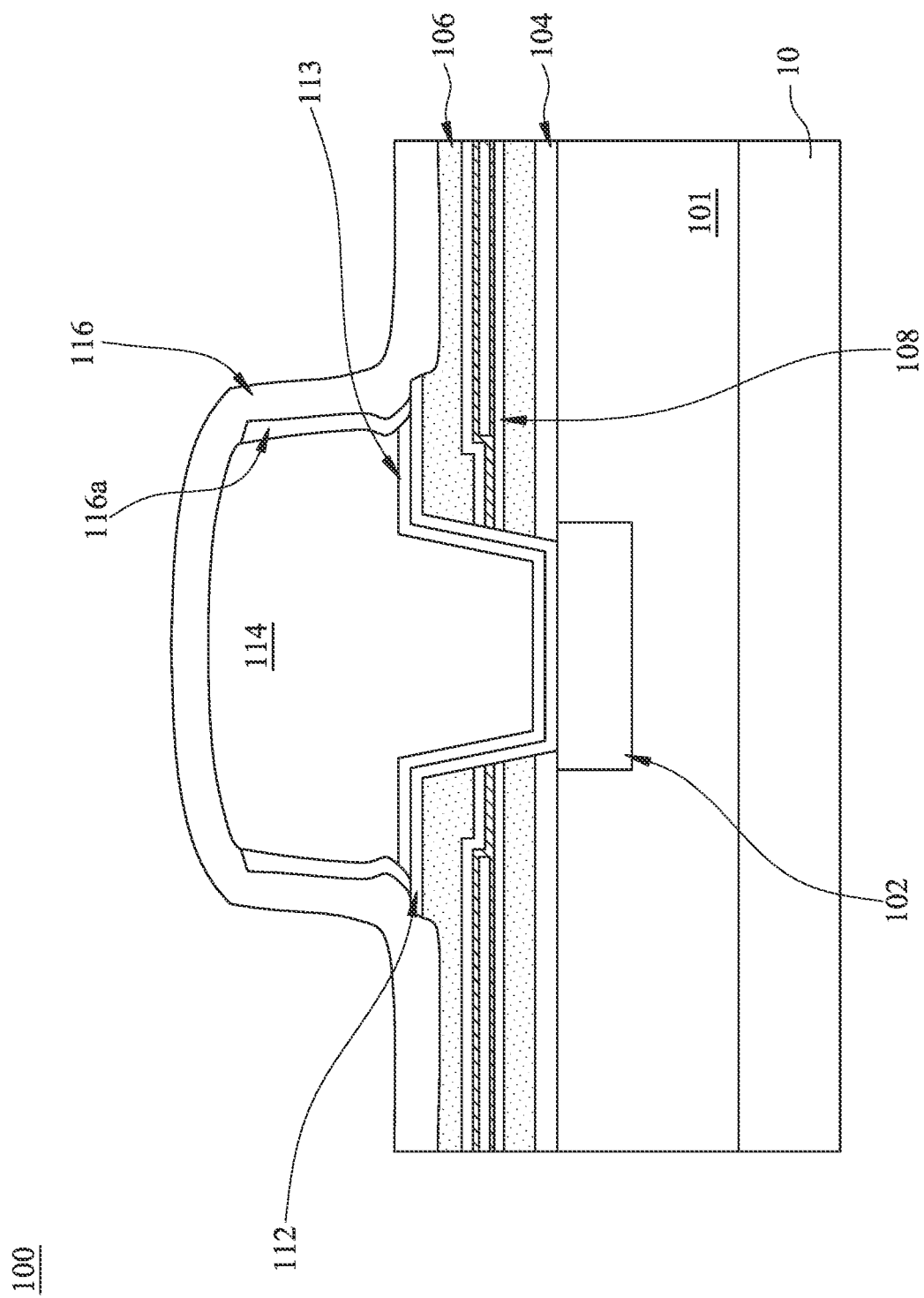
FIG. 2A and FIG. 2B are cross-sectional views of additional stages of a sequential fabrication process of a semiconductor device according to some embodiments.
Figure 2B:
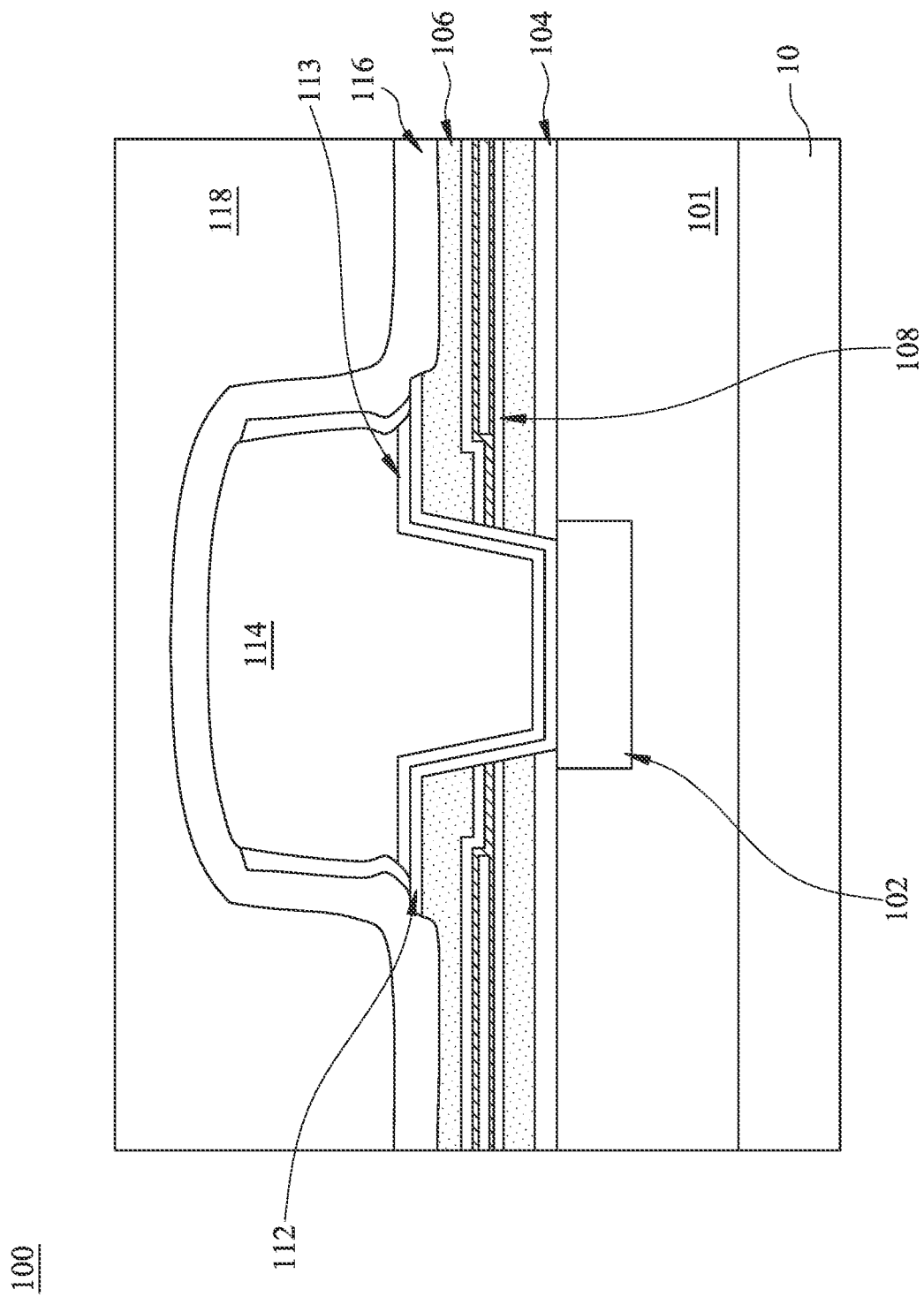

FIG. 2A and FIG. 2B are cross-sectional views of subsequent stages of a sequential fabrication process of the semiconductor device 100 according to various embodiments. Turning to FIG. 2A, in various embodiments, a silicon nitride ($Si_xN_y$) layer 116 (sometimes referred to as a second passivation layer) is disposed and deposited on the metal RDL 114 and over the top surface of the first passivation layer 106. In various instances, the silicon nitride layer 116 comprises more than one coextensive overlying layers, such as silicon nitride layer 116a that is first deposited before silicon nitride layer 116. In some embodiments, the various layers of silicon nitride layer 116 are composed of like materials, including the materials described herein above. In some cases, the silicon nitride layer 116 is composed of a first layer having a thickness between about 0.1 nm and about 10 µm and a second layer having a thickness between about 0.1 nm and about 10 µm. In some embodiments, a top surface of the silicon nitride layer 116 is smoothed by a planarization process or the like, to prevent additional stresses of the formation of voids.

Turning to FIG. 2B, a polyimide layer 118 is next deposited over the silicon nitride layer 116 in various instances. In some embodiments, a thickness of the polyimide layer 118 disposed over the silicon nitride layer 116 and the metal RDL 114 is no more than about 4 μm in order to reduce stresses on these underlying layers. In some embodiments, a thickness of the remaining polyimide layer 118 disposed over the silicon nitride layer 116 alone is substantially greater than 4 μm.

In various embodiments, design requirements of the semiconductor device 100 will require connection of the metal RDL 114 to additional semiconductor device components. This is accomplished in many cases by adding a metal bump or other conductive connection extending to the metal RDL 114 through openings in the polyimide layer 118 and the silicon nitride layer 116 overlying the metal RDL 114. It has been determined through experimentation and practice that when the interior angles of the openings in the polyimide layer 118 and underlying silicon nitride layer 116 are too shallow, stress may be induced on subsequent metal bump layers or the like that are deposited within such openings. Accordingly, the following operations have been introduced to the manufacturing process of the semiconductor device 100.

Figure 3A:
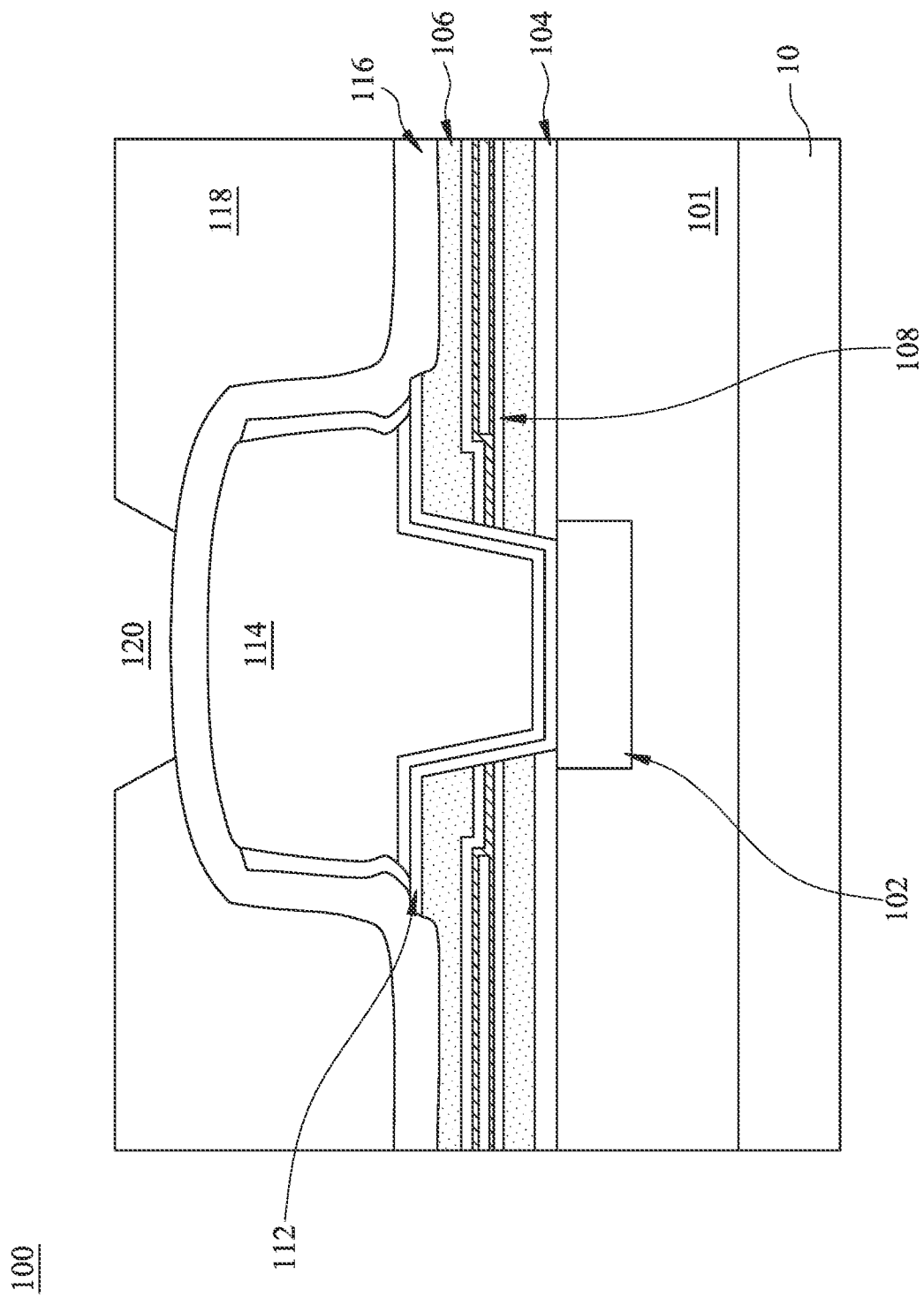
FIG. 3A, FIG. 3B and FIG. 3C are cross-sectional views of further stages of a sequential fabrication process of a semiconductor device according to some embodiments.
Figure 3B:
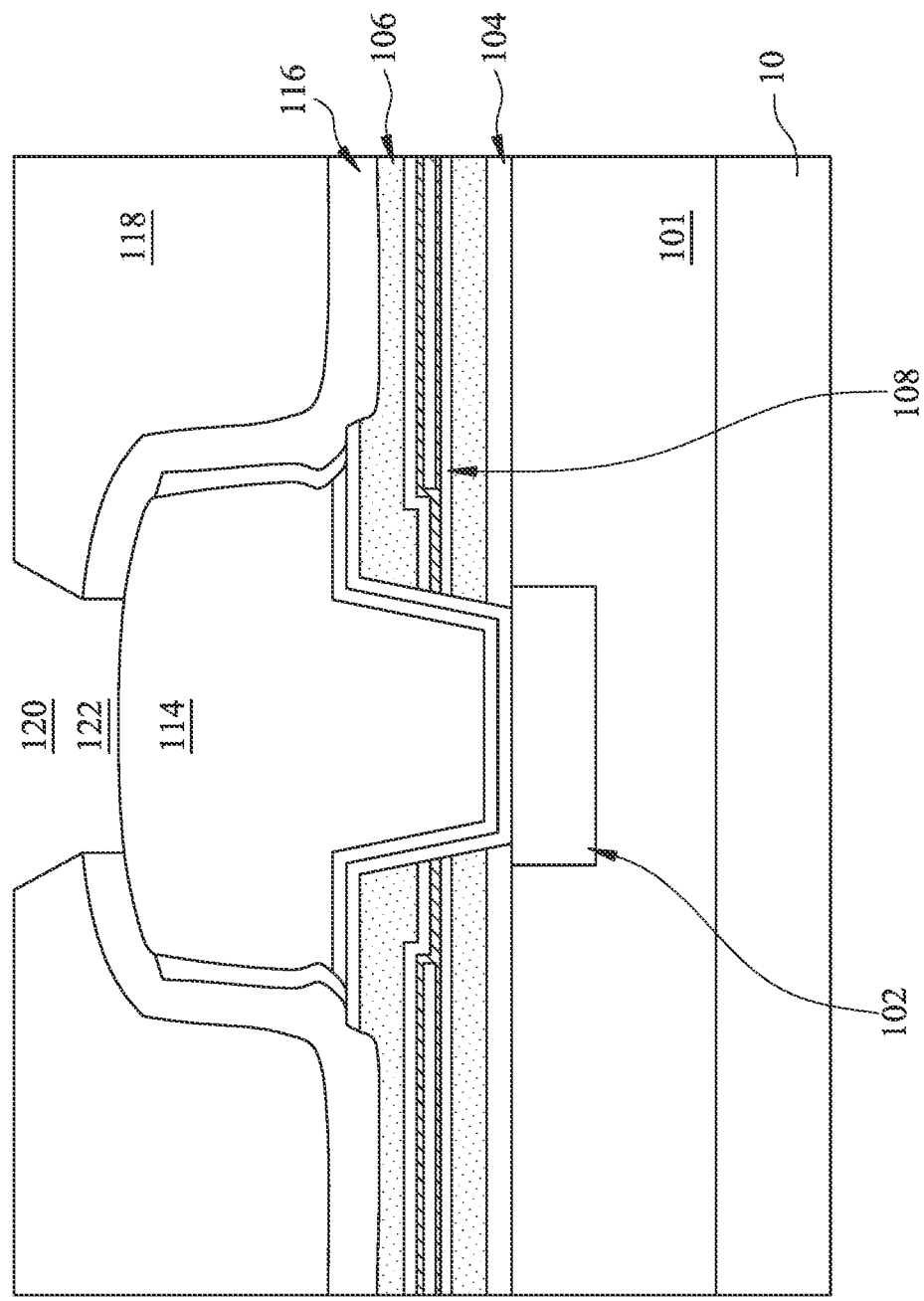
Figure 3C:
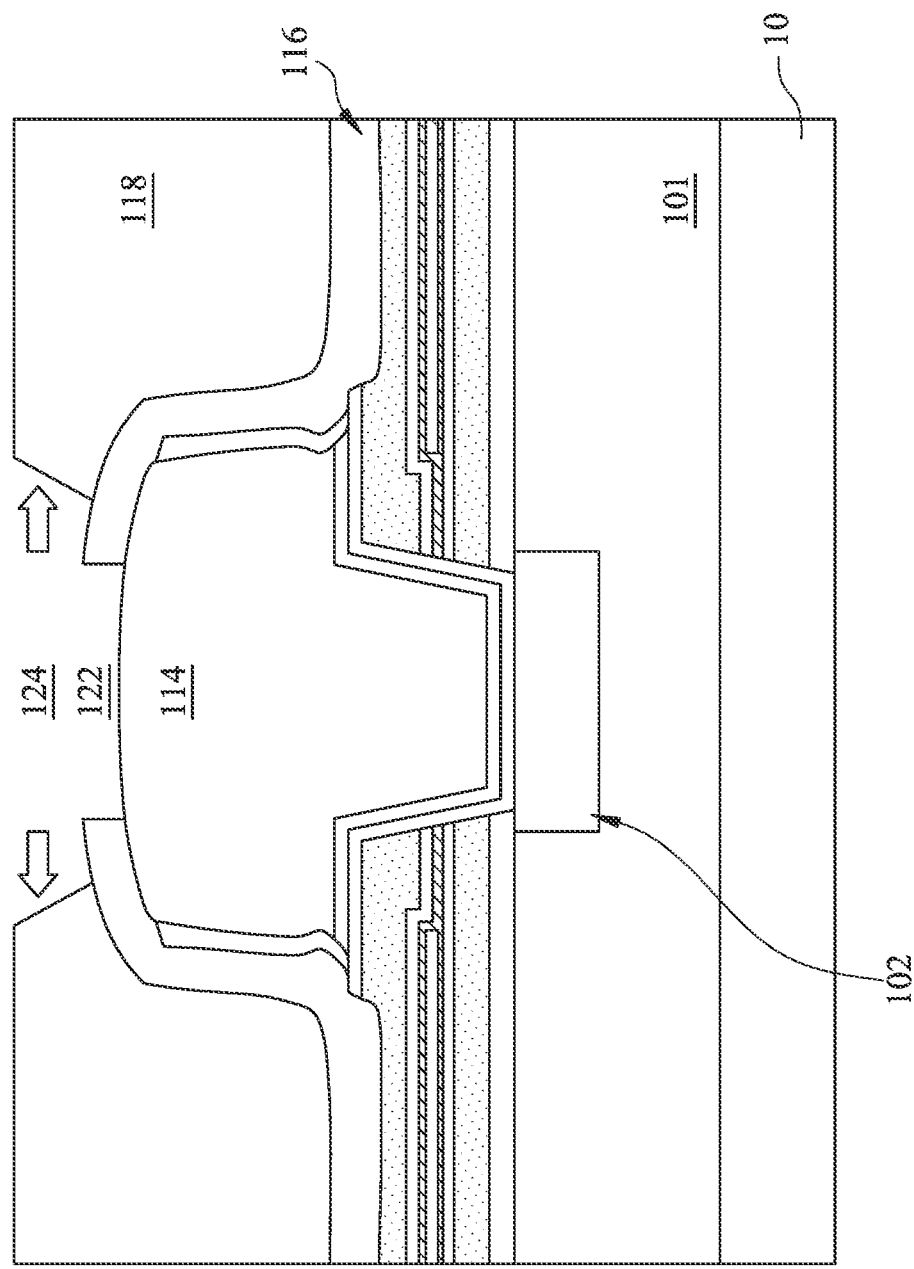

FIG. 3A, FIG. 3B and FIG. 3C are cross-sectional views of further subsequent stages of a sequential fabrication process of the semiconductor device 100 according to various embodiments. Turning to FIG. 3A, an opening 120 in the polyimide layer over a portion of the metal RDL layer 114 is formed by an etching process or by successive coating developing and curing processes followed by a descum process. In various cases, the descum process is performed to clean residues left by the patterning process. The descum process 110 may be a plasma process performed using a process gas including $CHF_3$, as an example. A process gas including $NF_3$ is instead or additionally used in some cases. In various embodiments, the use of process gas induces a lateral etch until the resulting bottom interior angle at an edge of the opening 120 in the polyimide layer 118 is much greater than 60 degrees, such as 75 to 85 degrees, for example 79 degrees. In some embodiments, a top interior angle at a top edge of the opening 120 in the polyimide layer 118 is much greater than 135 degrees, such as 160 to 170 degrees from horizontal. In some instances, one or more such descum etching operations are performed until the desired design requirements are achieved. The descum operation accomplishes superior definition of the bottom interior angles of the silicon nitride layer 116 and the polyimide layer 118 at their junction with the opening 122 and the opening 120, respectively.

Turning to FIG. 3B, an etch process is performed to form an opening 122 in the silicon nitride layer 116 that is substantially coextensive with the opening 120. In order to reduce stress on a top surface thereof, subsequent cracks formed therein or delamination with additional layers, in various embodiments, the opening 122 is formed such that a bottom interior angle of the edge of the opening 122 in the silicon nitride layer 116 is much greater than 28 degrees, such as between 75 degrees and 85 degrees, for example, 77 degrees. In various embodiments, the edge of the opening 122 is substantially flush with the edge of the opening 120.

Turning to FIG. 3C, in various embodiments, a pull-back process is performed to widen the opening 120 to form opening 124, which has a wider width or critical dimension (CD) than the opening 122, thereby exposing a portion of the top surface of the silicon nitride layer 116 that is disposed below the opening 124. In some embodiments, the pull-back process uses a plasma or wet etch to expand the opening 120 to form wider opening 122. A hard mask is used in some instances to maintain the upper and lower interior angles of the exposed edges of the polyimide layer 118. In various embodiments, the pull-back process extends the width of the polyimide opening 124 much greater than 0.45 μm, such as between 0.55 μm and 0.65 μm, such as 0.6 μm. In various embodiments, a radius or maximum width of the opening 124 is at least 0.6 μm greater than a width of the opening 122, and a diameter of the opening 124 is at least 1.2 micrometers greater than a diameter of the opening 122.

Figure 4A:
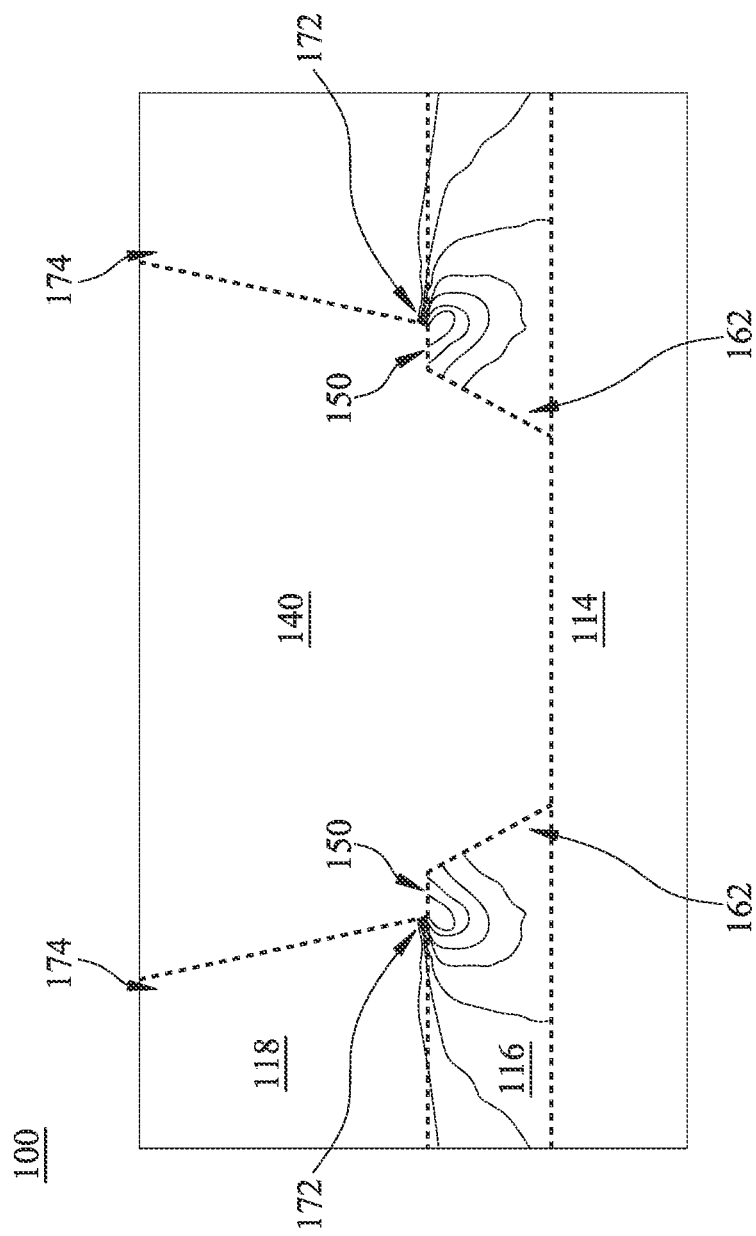
FIG. 4A and FIG. 4B are cross-sectional views of still further stages of a fabrication process of a semiconductor device according to some embodiments.
Figure 4B:
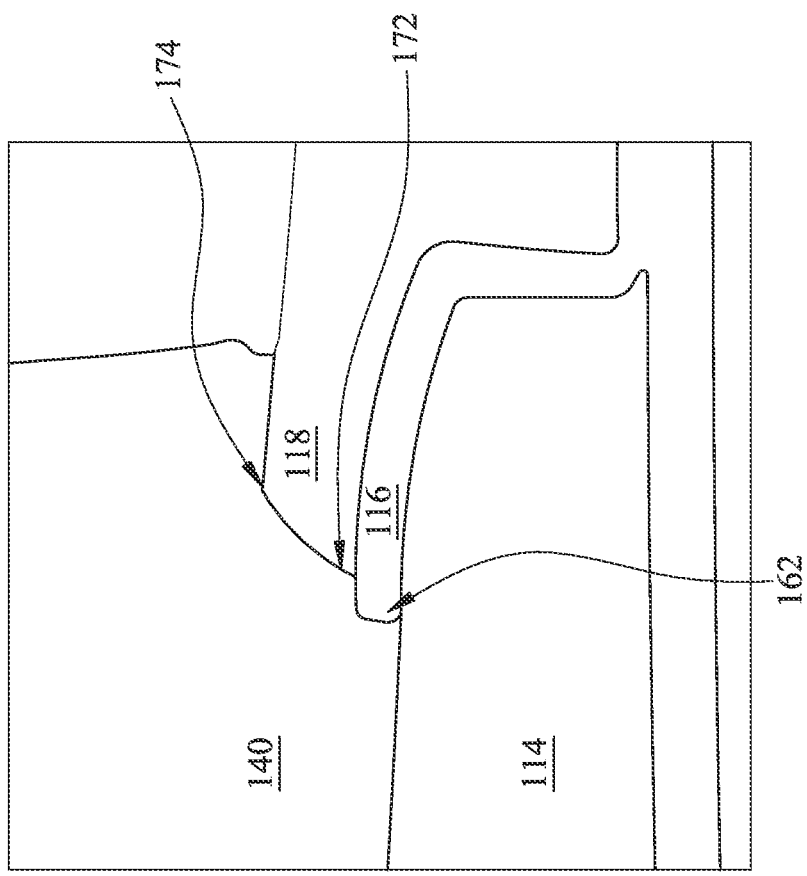

FIG. 4A and FIG. 4B are cross-sectional views of further stages of an exemplary sequential fabrication process of the semiconductor device 100 according to various embodiments. Turning to FIG. 4A, a metal bump layer 140 is formed within the opening 124 and the opening 122 above the metal RDL 114 in various instances. In some embodiments, the metal bump layer 140 is composed of a conductive metal, such as copper, although other conductive materials are contemplated for the metal RDL 114 are available. In some embodiments, the metal bump layer 140 provides electrical contact between the metal RDL 114, the MIM capacitor layer 108 and the TM layer 102 with other external electrical components on or external to the wafer 10. In various embodiments, the metal bump layer 140 intersects the polyimide layer 118 and the silicon nitride layer 116 at the edges thereof in the openings through such layers. In various instances, the metal bump layer 140 extends above the silicon nitride layer 116 and the polyimide layer 118 to enable such electrical connections. In some cases, the metal bump layer 140 is a single continuous layer. In other instances, the metal bump layer 140 is formed from a sequence of deposited layers (not shown).

Over time, stress on the meal bump layer 140 is induced by the top exposed surface 150 of the silicon nitride layer 116. By forming the exposed edges of the silicon nitride layer 116, such that its bottom interior angle 162 is between about 75 and about 85 degrees, such as 77 degrees, the induced stress at the top exposed surfaces 150 has been determined to decrease such that the formation of kinks and voids are reduced. By forming the exposed edges of the polyimide layer 118, such that its bottom interior angle 172 is between about 60 and about 85 degrees (such as 79 degrees), and so that its top interior angle 174 is between about 160 and about 170 degrees (such as 165 degrees), the induced stress at the top exposed surfaces 150 has been determined to decrease such that the formation of kinks and voids, as well as the possibility of delamination or cracking of the metal bump layer 140, are all reduced.

Turning to FIG. 4B, the relationship between the interior angles 162, 172 and 174 are shown in relation to the polyimide layer 118, the underlying silicon nitride layer 116, the metal RDL 114 and the metal bump layer 140, in various embodiments.

Figure 5:
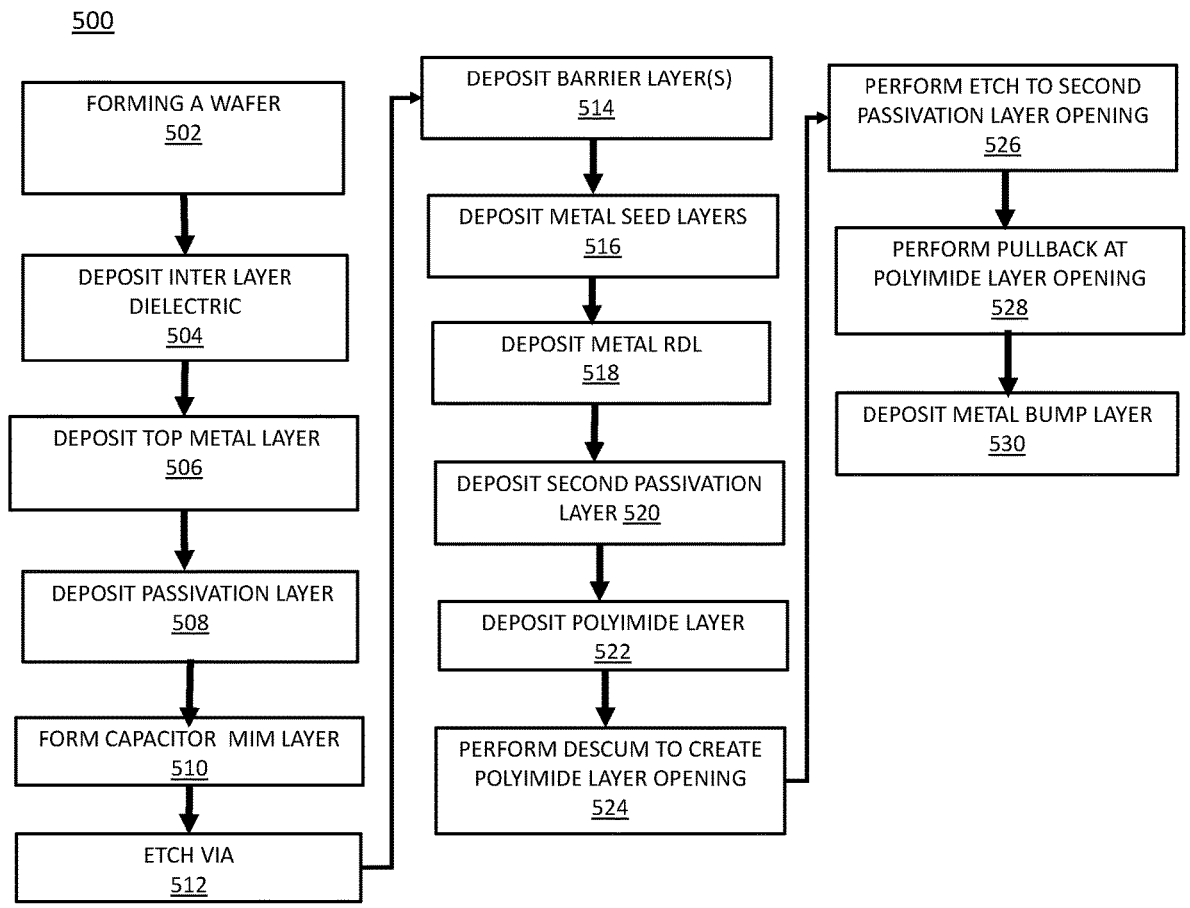
FIG. 5 a flowchart of a semiconductor manufacturing process according to some embodiments.

FIG. 5 is a flowchart of an exemplary sequential fabrication process 500 of the semiconductor device 100 according to various non-limiting embodiments. At operation 502, a wafer, such as wafer 10 is provided. Next, at operation 504, an ILD 101 is provided and disposed on the wafer 10. Next at operation 506, a TM layer 102 is deposited towards a top surface of the ILD 101 and a planarization process may be introduced for smoothing the top surface and making the top surface of the TM layer 102 substantially smooth. Next, at operation 508, a passivation layer 106 is provided and disposed on top of the ILD 101 and the TM layer 102. Next, at operation 510, a MIM capacitor layer 108 is formed over the passivation layer 106, and another passivation layer 106 is provided and disposed on the MIM capacitor layer 108. Next, at operation 512, an etch is performed to create a via through the passivation layer 106 and the MIM capacitor layer 108. Next, at operation 514, a barrier layer 112 is provided and disposed within the via and over the top surface of the passivation layer 106. Subsequently, at operation 516, a metal seed layer 113 is provided and disposed over the barrier layer 112.

Continuing to operation 518, a metal RDL 114 is provided within the via and over the metal seed layer 113. Next, at operation 520, a silicon nitride layer 116 is provided over the metal RDL 114. At subsequent operation 522, a polyimide layer 118 is provided and disposed over the silicon nitride layer 116, wherein the polyimide layer 118 has an opening 120 therein. At operation 524, a descum process is performed to adjust a profile of the opening 120 in the polyimide layer 118 over the metal RDL 114. At operation 526, an etching process is performed to create an opening 122 in the silicon nitride layer 116 over the metal RDL 114 and under the opening 120. At operation 528, a pull-back process is performed to create widened opening 124 using a plasma or gas lateral etch of the polyimide layer 118. Finally, at operation 530, a metal bump layer 140 is provided and disposed over the exposed metal RDL layer 1144 to afford electrical connection with the semiconductor device 100 and other electrical components. The process 500 may repeat for other sections of the wafer 10 or with additional wafers 10 within a large-scale manufacturing operation.

Figure 6:
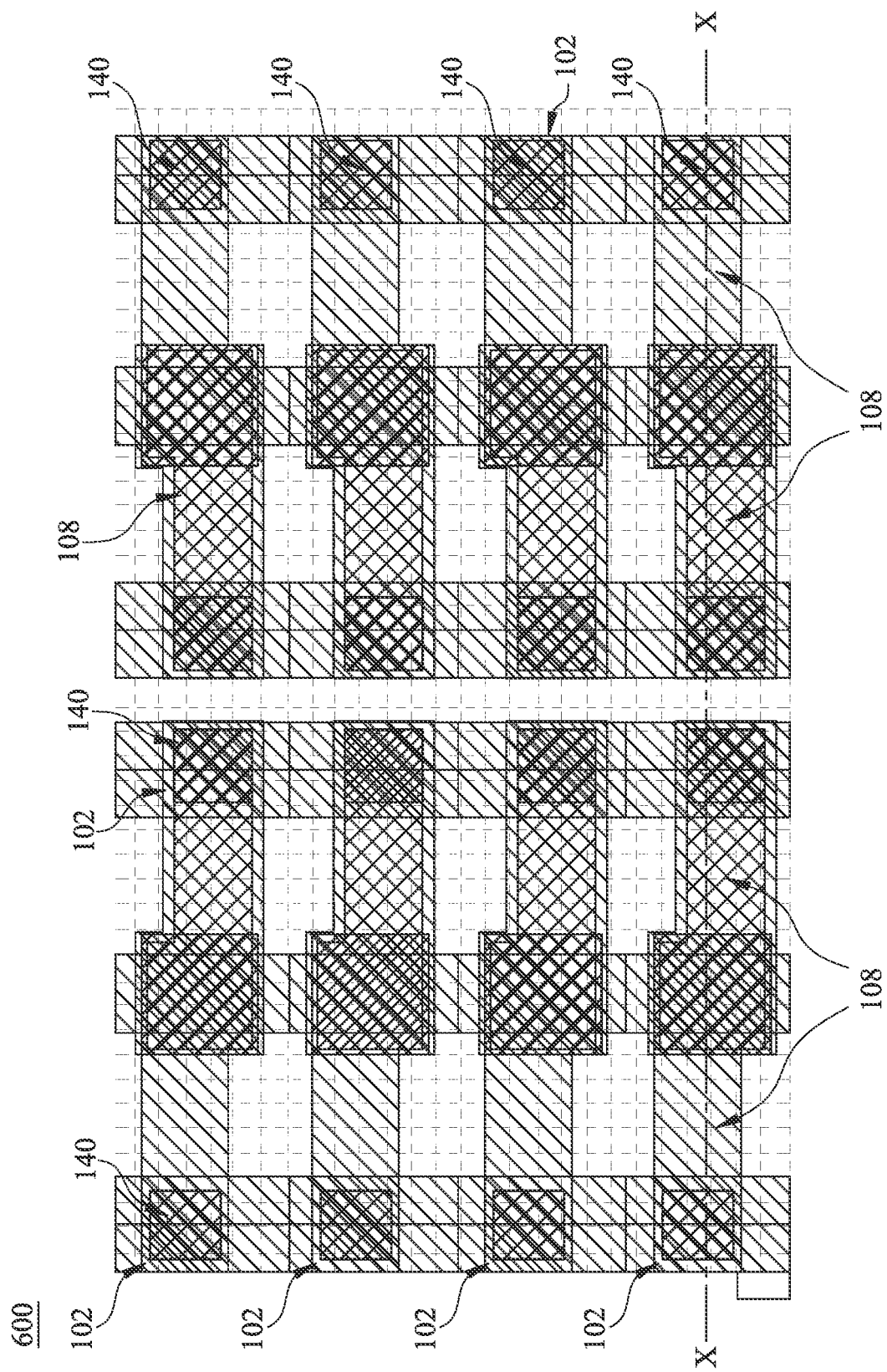
FIG. 6 is a cross-sectional view of a wire diagram of a semiconductor device according to some embodiments.

FIG. 6 is a top view 600 of a layout of multiple copies of the semiconductor device 100 according to some embodiments, where various TM layers 102, and metal bump layers 140 are shown in relation to one another. A portion of the cross-sectional line X-X as shown corresponds to the cross-sectional view shown in the previous Figures.

In various embodiments, computer simulations project that stress produced over prior manufacturing techniques using increased interior angles of the polyimide layer and silicon nitride layer openings. This disclosure introduces methods and apparatus for manufacturing a semiconductor device 100 that results in improved stress relief of the underlying layers typically induced by high stress areas of the structure causing kinks and voids. The solutions described herein provide little impact or change to existing manufacturing processes and are beneficial to boosting device yield. Although described primarily with respect to capacitor devices, the solutions herein are likewise useful in the manufacture of other similar semiconductor devices.

According to various embodiments, a method of forming a semiconductor device includes: (i) forming a metal redistribution layer (RDL) within a via hole of a first passivation layer disposed over a wafer; (ii) depositing a second passivation layer over a portion of the metal RDL; (iii) depositing a polyimide layer over the second passivation layer; (iv) performing a descum etching operation to etch a first opening through the polyimide layer to expose a portion of the second passivation layer over the metal RDL; and (v) etching the portion of the second passivation layer exposed in the first opening to form a second opening to the metal RDL such that a vertical cross-section of the second passivation layer at the second opening has a bottom angle between about 75 degrees and 85 degrees from horizontal. In some embodiments, the method further includes performing a pull-back operation of the polyimide layer to expose a top surface of a second portion of the second passivation layer such that a vertical cross section of the polyimide layer at the first opening has a top or upper angle of between 160 and 170 degrees from horizontal and a bottom angle of between 75 and 85 degrees from horizontal. In some embodiments, the method further includes performing the pull-back operation until a width of the first opening is at least 1.2 micrometers greater than a diameter of the second opening. In some embodiments, the method further includes performing the pull-back operation until a radius of the first opening is at least 0.6 micrometers greater than a diameter of the second opening. In some embodiments, the method further includes depositing a metal bump layer over the metal RDL and the first and second openings. In some embodiments, the method further includes depositing the first passivation layer over the wafer, forming an encapsulated metal-insulator-metal (MIM) capacitor layer within the first passivation layer, and forming the via hole by etching through the first passivation layer and the MIM capacitor layer. In some embodiments, the method further includes depositing a barrier layer over the first passivation layer and within the via hole. In some embodiments, the method further includes depositing a metal seed layer over the barrier layer. In some embodiments, the method further includes depositing an interlayer dielectric (ILD) over a top surface of the wafer, depositing a top metal layer within a portion of the ILD, and depositing the first passivation layer over the top metal layer and the ILD. In some embodiments, the method further includes prior to said depositing the first passivation layer, depositing an etch stop layer over a top surface of the ILD and the top metal layer and depositing the first passivation layer on the etch stop layer. In some embodiments, the method further includes exposing the polyimide layer within the first opening to nitrogen trifluoride ($NF_3$) gas during the descum etching operation.

According to various embodiments, a method of forming a semiconductor device includes: (i) providing a passivation layer over a metal contact; (ii) providing a metal-insulator-metal (MIM) capacitor layer within the passivation layer; (iii) providing a redistribution layer (RDL) extending through a portion of the passivation layer and the MIM capacitor layer; (iv) providing a silicon nitride layer over a portion of the RDL; (v) providing a polyimide layer over the silicon nitride layer; and (vi) providing a metal bump layer extending through the silicon nitride layer and the polyimide layer and in contact with the RDL, wherein an interior bottom angle at an intersection of the metal bump layer and the polyimide layer is between 60 degrees and 85 degrees. In some embodiments, the method further includes providing a first vertically extending edge of the polyimide layer in contact with the metal bump layer, the first vertically extending edge having a top angle of between 160 degrees and 170 degrees and a bottom angle of between 75 degrees and 85 degrees. In some embodiments, the method further includes providing a second vertically-extending edge through the silicon nitride layer in contact with the metal bump layer, the second vertically extending edge having a bottom interior angle of between 75 degrees and 85 degrees. In some embodiments, the method further includes providing a barrier layer over the passivation layer and under the metal RDL. In some embodiments, the method further includes providing a metal seed layer between the barrier layer and the metal RDL. In some embodiments, the method further includes providing a metal bump layer through the silicon nitride layer and the polyimide layer and in contact with the metal RDL.

According to various embodiments, a semiconductor device includes a passivation layer disposed over a metal contact layer of a wafer, an encapsulated metal-insulatormetal (MIM) capacitor layer disposed within the passivation layer, and a metal redistribution layer (RDL) disposed over a portion of a top surface of the passivation layer and extending through the MIM capacitor layer. In various embodiments, the device further includes a silicon nitride (SiN) layer disposed over a portion of the metal RDL, the SiN layer having a first opening to a top of the metal RDL, wherein a cross-section of the SiN layer at the first opening has an interior bottom angle of between 75 degrees and 85 degrees. In various embodiments, the device further includes a polyimide layer disposed over the SiN layer, the polyimide layer having a second opening disposed at least in part over the first opening to the metal RDL, where a cross section of the polyimide layer at the second opening has a top angle of between 160 and 170 degrees and a bottom angle of between 75 and 85 degrees. In some embodiments, a vertical thickness of the polyimide layer over the metal RDL is less than 4 micrometers. In some embodiments, a diameter of the second opening is at least 1.2 micrometers greater than a diameter of the first opening.

The foregoing outlines features of several embodiments or examples so that those skilled in the art better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a metal redistribution layer (RDL) within a via hole of a first passivation layer disposed over a wafer;
    depositing a second passivation layer over a portion of the metal RDL;
    depositing a polyimide layer over the second passivation layer;
    performing an etching operation to form a first opening through the polyimide layer that exposes a first portion of the second passivation layer over the metal RDL;
    performing a descum operation to adjust the first opening; and
    etching the first portion of the second passivation layer exposed in the first opening to form a second opening to the metal RDL.

2. The method of claim 1, further comprising:
    etching the first portion of the second passivation layer such that a vertical cross-section of the second passivation layer at the second opening has a bottom angle between about 75 degrees and 85 degrees from horizontal.

3. The method of claim 1, further comprising:
    performing a pull-back operation of the polyimide layer to expose a top surface of a second portion of the second passivation layer such that a vertical cross section of the polyimide layer at the first opening has an upper angle of between 160 and 170 degrees from horizontal and a bottom angle of between 75 and 85 degrees from horizontal.

4. The method of claim 3, further comprising:
    performing the pull-back operation until a width of the first opening is at least 1.2 micrometers greater than a diameter of the second opening.

5. The method of claim 3, further comprising:
    performing the pull-back operation until a radius of the first opening is at least 0.6 micrometers greater than a diameter of the second opening.

6. The method of claim 1, further comprising:
    depositing a metal bump layer over the metal RDL and the first and second openings.

7. The method of claim 1, further comprising:
    depositing the first passivation layer over the wafer;
    encapsulating a metal-insulator-metal (MIM) capacitor layer within the first passivation layer; and
    forming the via hole by etching through the first passivation layer and a metal layer of the MIM capacitor layer.

8. The method of claim 7, further comprising:
    depositing a barrier layer over the first passivation layer and within the via hole.

9. The method of claim 8, further comprising:
    depositing a metal seed layer over the barrier layer.

10. The method of claim 1, further comprising:
    depositing an interlayer dielectric (ILD) over a top surface of the wafer;
    depositing a top metal layer within a portion of the ILD; and
    depositing the first passivation layer over the top metal layer and the ILD.

11. The method of claim 10, further comprising:
    prior to said depositing the first passivation layer, depositing an etch stop layer over a top surface of the ILD and the top metal layer; and
    depositing the first passivation layer on the etch stop layer.

12. The method of claim 1, further comprising
    exposing the polyimide layer within the first opening to nitrogen trifluoride ($NF_3$) gas during the descum operation.

13. A method of manufacturing a semiconductor device having improved layer openings for supporting a metal bump, comprising:
    providing a passivation layer over a metal contact;
    providing a metal-insulator-metal (MIM) capacitor layer within the passivation layer;
    providing a redistribution layer (RDL) extending through a portion of the passivation layer and the MIM capacitor layer;
    providing a silicon nitride layer over a portion of the RDL;
    providing a polyimide layer over the silicon nitride layer; and providing a metal bump layer extending through the silicon nitride layer and the polyimide layer and in contact with the RDL, wherein an interior bottom angle at an intersection of the metal bump layer and the polyimide layer is between 60 degrees and 85 degrees.

14. The method of claim 13, further comprising:
    providing a first vertically-extending edge of the polyimide layer in contact with the metal bump layer, the first vertically extending edge having an upper angle of between 160 degrees and 170 degrees.

15. The method of claim 13, further comprising:
    providing a second vertically-extending edge through the silicon nitride layer in contact with the metal bump layer, the second vertically extending edge having a bottom interior angle of between 75 degrees and 85 degrees.

16. The method of claim 13, further comprising:
providing a barrier layer over the passivation layer and under the metal RDL.

17. The method of claim 16, further comprising:
providing a metal seed layer between the barrier layer and the metal RDL.

18. A semiconductor device, comprising:
a passivation layer disposed over a metal contact layer of a wafer;
a metal redistribution layer (RDL) disposed over a portion of a top surface of the passivation layer;
a silicon nitride (SiN) layer disposed over a portion of the metal RDL, the SiN layer having a first opening to a top of the metal RDL, wherein a cross-section of the SiN layer at the first opening has an interior bottom angle of between 75 degrees and 85 degrees; and
a polyimide layer disposed over the SiN layer, the polyimide layer having a second opening disposed at least in part over the first opening to the metal RDL, where a cross section of the polyimide layer at the second opening has a top angle of between 160 and 170 degrees and a bottom angle of between 75 and 85 degrees.

19. The semiconductor device of claim 18, wherein a vertical thickness of the polyimide layer over the metal RDL is less than 4 micrometers.

20. The semiconductor device of claim 18, wherein a diameter of the second opening is at least 1.2 micrometers greater than a diameter of the first opening.

* * * * *